United States Patent
Chen et al.

(10) Patent No.: US 7,570,496 B2
(45) Date of Patent: Aug. 4, 2009

(54) ELECTROMAGNETIC INTERFERENCE SHIELDING APPARATUS FOR SIGNAL TRANSCEIVER

(75) Inventors: Ruei Yuen Chen, Hsinchu (TW); Fang Yu Kuo, Hsinchu (TW); Yi Hsiang Huang, Hsinchu (TW)

(73) Assignee: Microelectronics Technology Inc., Hinchu (TW)

( * ) Notice: Subject to any disclaimer, the term of this patent is extended or adjusted under 35 U.S.C. 154(b) by 18 days.

(21) Appl. No.: 11/896,230

(22) Filed: Aug. 30, 2007

(65) Prior Publication Data

US 2008/0123316 A1     May 29, 2008

(30) Foreign Application Priority Data

Nov. 28, 2006   (TW) .............................. 95220919 U

(51) Int. Cl.
    *H05K 9/00*     (2006.01)
(52) U.S. Cl. .................. 361/818; 361/800; 361/816; 361/799; 361/753; 174/350; 174/371; 174/377
(58) Field of Classification Search ............. 361/800, 361/816, 818, 799, 753; 174/50.5, 50.51, 174/350, 371, 377; 439/607
    See application file for complete search history.

(56) References Cited

U.S. PATENT DOCUMENTS

| | | | | |
|---|---|---|---|---|
| 2,527,908 A | * | 10/1950 | Blitz | 174/9 F |
| 5,045,971 A | * | 9/1991 | Ono et al. | 361/704 |
| 5,565,656 A | * | 10/1996 | Mottahed | 174/372 |
| 5,600,091 A | * | 2/1997 | Rose | 174/372 |
| 5,880,400 A | * | 3/1999 | Leischner et al. | 174/17 CT |
| 6,407,925 B1 | * | 6/2002 | Kobayashi et al. | 361/752 |
| 6,549,426 B1 | * | 4/2003 | Lawlyes et al. | 361/816 |
| 6,707,678 B2 | * | 3/2004 | Kobayashi et al. | 361/752 |
| 7,035,617 B2 | * | 4/2006 | Buer et al. | 455/326 |
| 7,358,438 B2 | * | 4/2008 | Zoller | 174/50 |
| 7,450,388 B2 | * | 11/2008 | Beihoff et al. | 361/715 |
| 2004/0189531 A1 | * | 9/2004 | Dohata | 343/700 MS |

* cited by examiner

*Primary Examiner*—Dameon E Levi
(74) *Attorney, Agent, or Firm*—Oliff & Berridge, PLC

(57) ABSTRACT

An electromagnetic interference shielding apparatus for a signal transceiver employs two folded-edge mechanisms coupled together and an adhesive. The electromagnetic interference shielding apparatus includes a metal cover, a chassis having a waveguide output hole, and an adhesive. A first combination portion having a first curved section is disposed on an edge of the metal cover. A second combination portion having a second curved section corresponding to the first combination portion is disposed on an edge of the chassis. The adhesive is used to combine the first combination portion and the second combination portion. The waveguide output hole outputs a signal transmitted by the signal transceiver. The first combination portion and the second combination portion form a curved space that is used with the adhesive to prevent leakage of the transmitted signal and the interference of external noises.

10 Claims, 8 Drawing Sheets

ELECTROMAGNETIC INTERFERENCE SHIELDING APPARATUS FOR SIGNAL TRANSCEIVER

BACKGROUND OF THE INVENTION

1. Field of the Invention

The present invention relates to an electromagnetic interference shielding apparatus for a signal transceiver. More particularly, the present invention relates to an electromagnetic interference shielding apparatus applicable to a high-frequency signal transceiver.

2. Description of the Related Art

Generally speaking, if is difficult for microwave signals transmitted between the earth and artificial satellites to pass through walls, roofs, or even glass windows. Therefore, satellite signal transceivers are located outdoors with antennas pointing directly at artificial satellites to obtain optimal transmission efficiencies. FIG. 1(a) shows a conventional shielding apparatus 10 of a block upconverter (BUC) accommodating an outdoor satellite signal transceiver (not shown), which is mainly used to protect the outdoor satellite signal transceiver from damage caused by the external environment (e.g., rain, moisture, etc.). FIG. 11(b) is a partial cross-sectional view of the shielding apparatus 10. The shielding apparatus 10 includes an upper cover 11, a chassis 12, and a waveguide output hole (not shown). When the shielding apparatus 10 is applied to protect the outdoor satellite signal transceiver, the outdoor satellite signal transceiver is placed in an internal space 15 formed by the cover 11 and the chassis 12. To enable the satellite signal transceiver to be used outdoors and be waterproof, the shielding apparatus 10 utilizes an O-ring 13 disposed between the cover 11 and the chassis 12, and employs a plurality of screws 14 to combine the cover 11 and the chassis 12. Meanwhile, pressure is applied to the O-ring 13 to deform the O-ring 13, thus realizing the waterproof function. However, the conventional shielding apparatus 10 has the following disadvantages: (1) the cover 11 and the chassis 12 are generally fabricated by die casting; when they are combined by the plurality of screws 14 and the O-ring 13, the slit between rough combined surfaces 111 and 121 cannot effectively stop the leakage of high-frequency signals (e.g., signals belonging to the Ku band, C band, or Ka band), and cannot effectively shield the interference of external noises; and (2) when disassembling or assembling the upper cover 11 and the chassis 12, the screws 14 must be loosened or fastened one by one, so much time and cost has to be spent during assembly and testing.

SUMMARY OF THE INVENTION

One aspect of the present invention is to provide an electromagnetic interference shielding apparatus for a signal transceiver, which employs two folded-edge mechanisms coupled together and an adhesive, so as to effectively stop the leakage of internal high-frequency signals and interference of external noises, and to form a sealed connection to prevent the permeation of external moisture.

Another aspect of the present invention is to provide an electromagnetic interference shielding apparatus for a signal transceiver, which employs the coupling of two folded-edge mechanisms and an adhesive directly used to make the two folded-edge mechanisms form the electromagnetic interference shielding apparatus. The electromagnetic interference shielding apparatus has the advantages of easy assembly, easy disassembly, and low material cost.

The present invention discloses an electromagnetic interference shielding apparatus, which is applicable to a signal transceiver, and includes a metal cover, an adhesive, and a chassis having a waveguide output hole. The metal cover includes a first combination portion having a first curved section is disposed on an edge of the metal cover. A second combination portion having a second curved section corresponding to the first combination portion is disposed on an edge of the chassis, and the chassis carries the signal transceiver. The adhesive combines the first combination portion and the second combination portion. A transmitted signal of the signal transceiver is outputted through the waveguide output hole. The first combination portion and the second combination portion form a curved space that is used with the adhesive to prevent leakage of the transmitted signal and the interference of external noises.

BRIEF DESCRIPTION OF THE DRAWINGS

The invention will be described according to the appended drawings in which.

DETAILED DESCRIPTION OF THE INVENTION

Figure 1A:
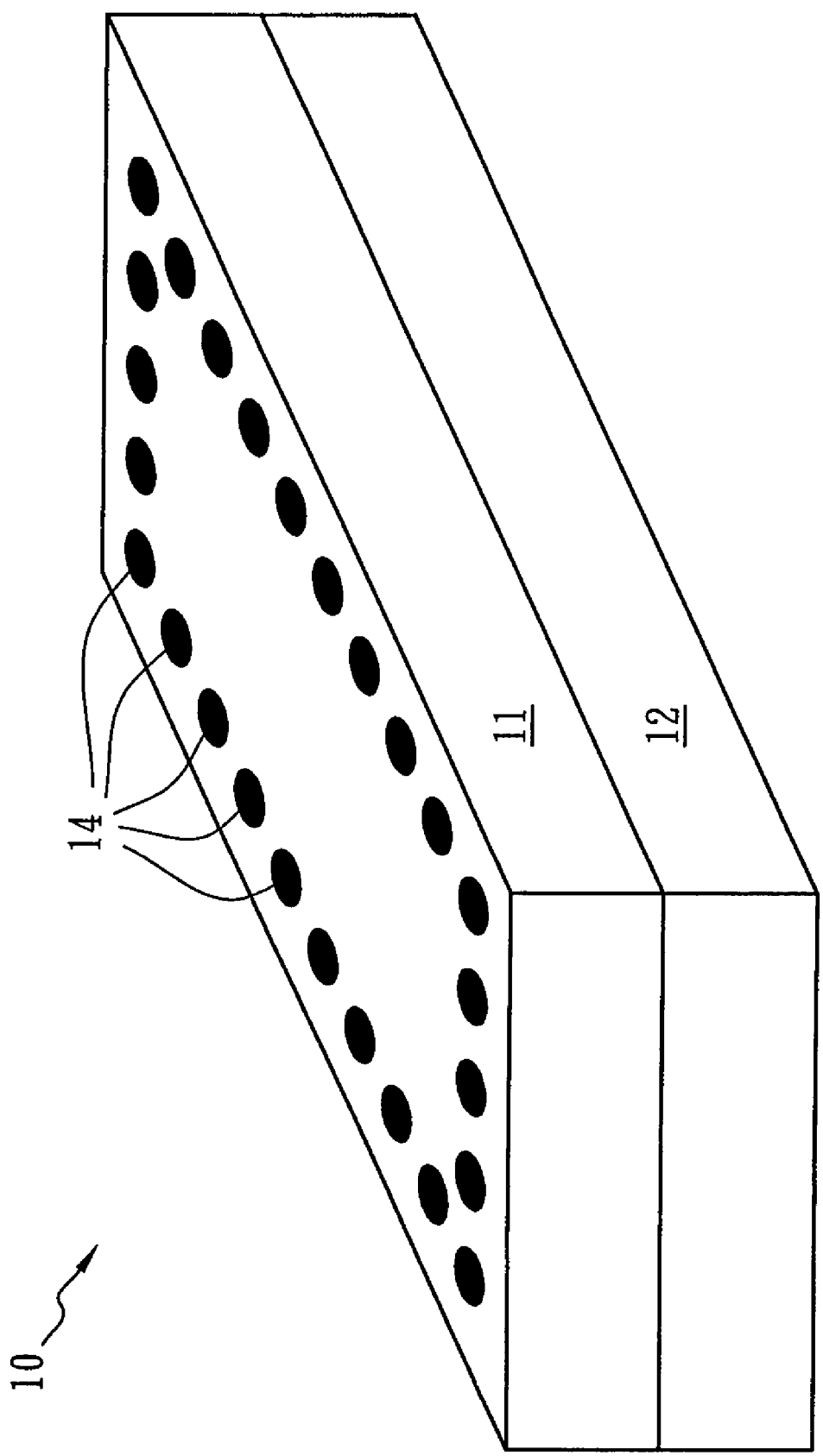
FIG. 1(a) shows a conventional shielding apparatus applied in an outdoor satellite signal transceiver.
Figure 1B:
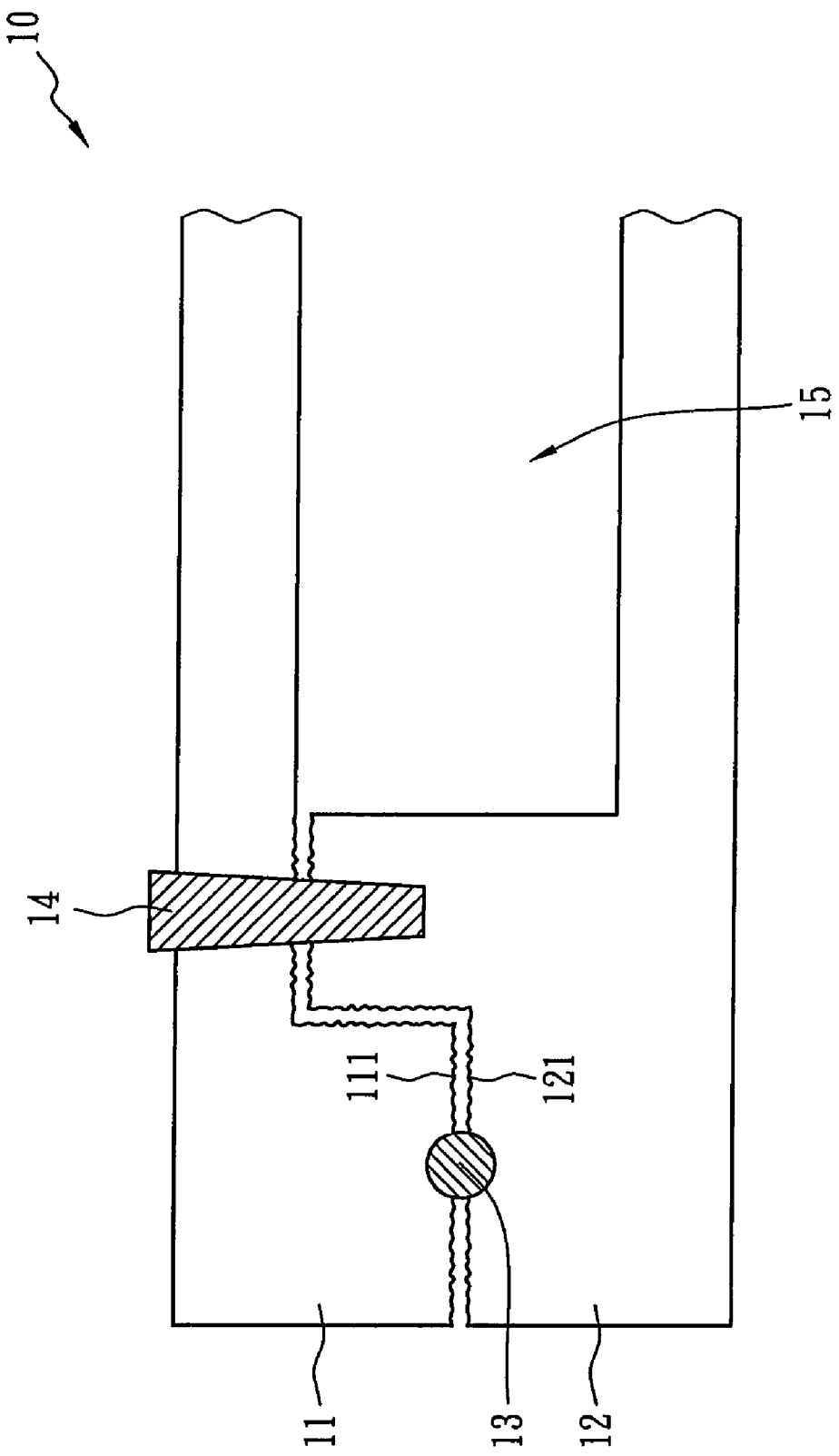
FIG. 1(b) is a partial cross-sectional view of FIG. 1(a)
Figure 2:
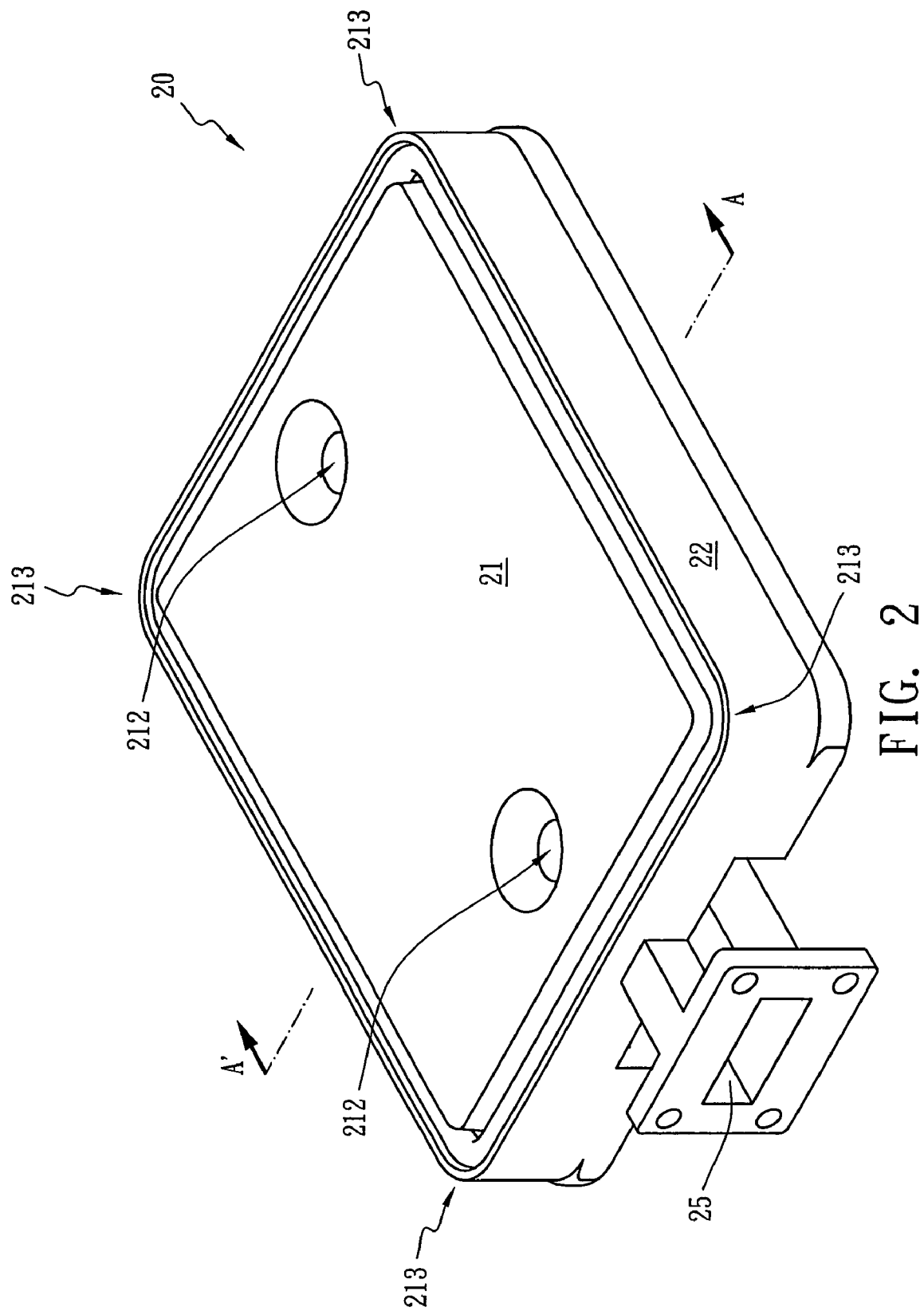
FIG. 2 shows an electromagnetic interference shielding apparatus according to an embodiment of the present creation.
Figure 3:
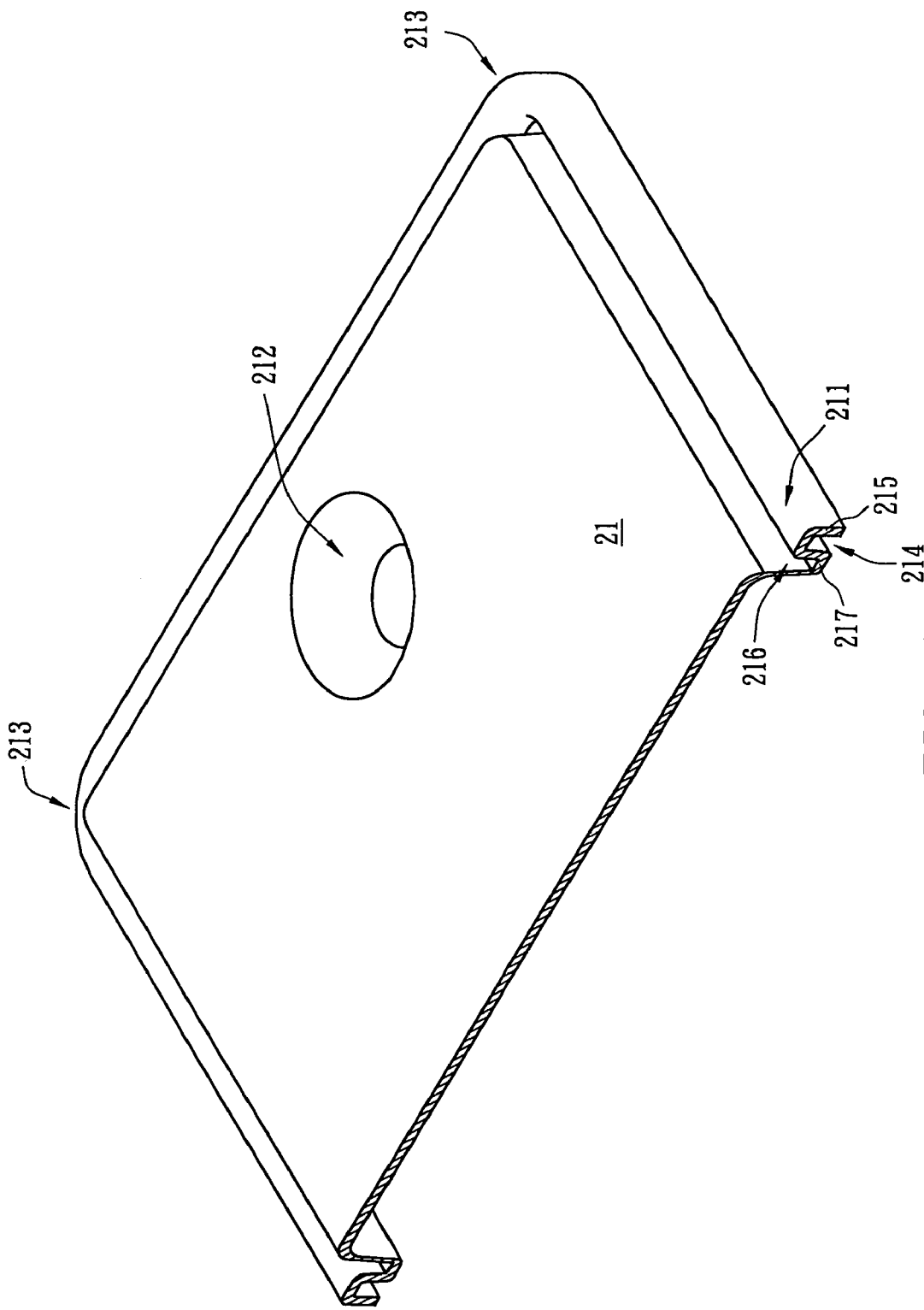
FIGS. 3 and 4 are sectional views of the metal cover and the chassis, respectively, of FIG. 2.
Figure 4:
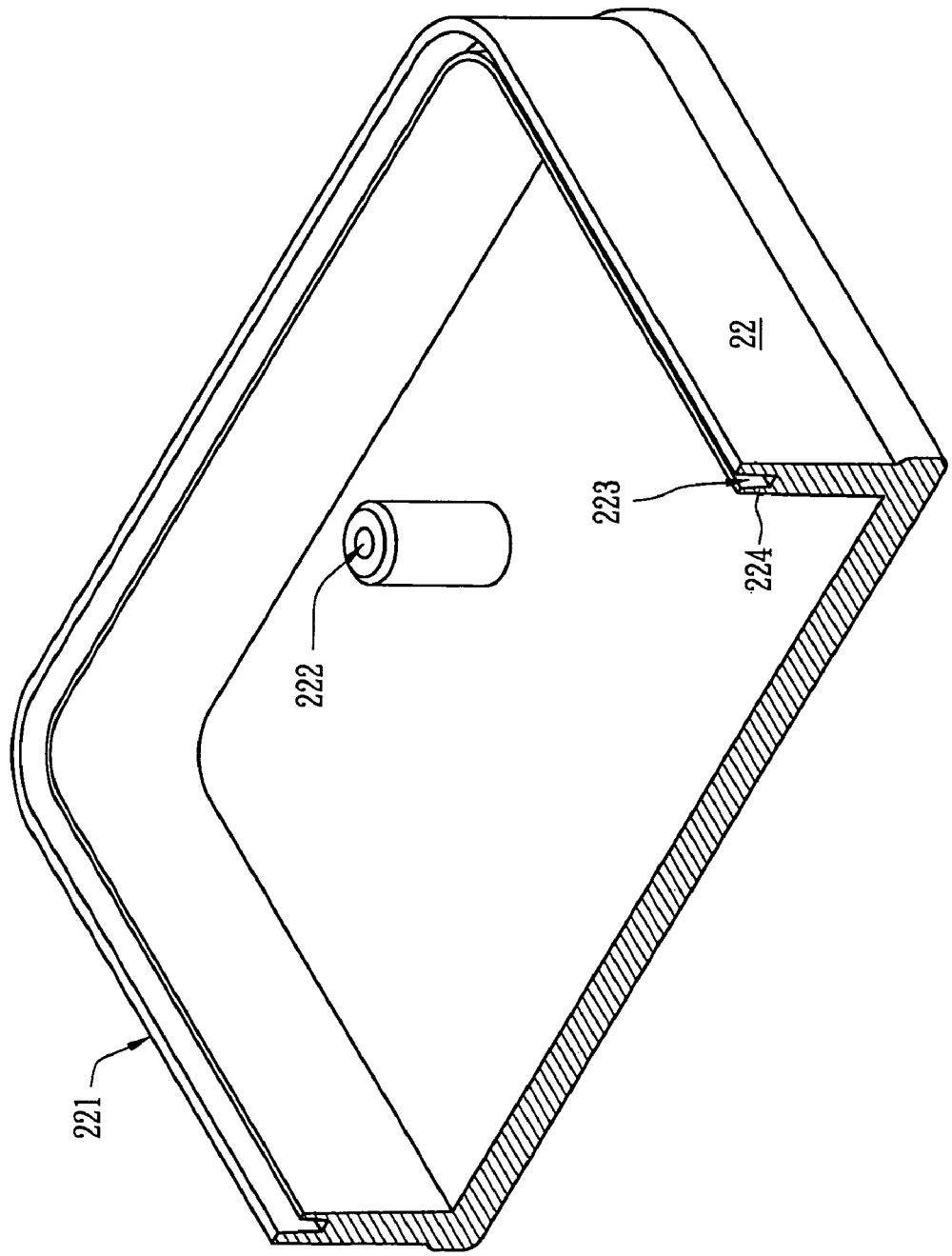
Figure 5:
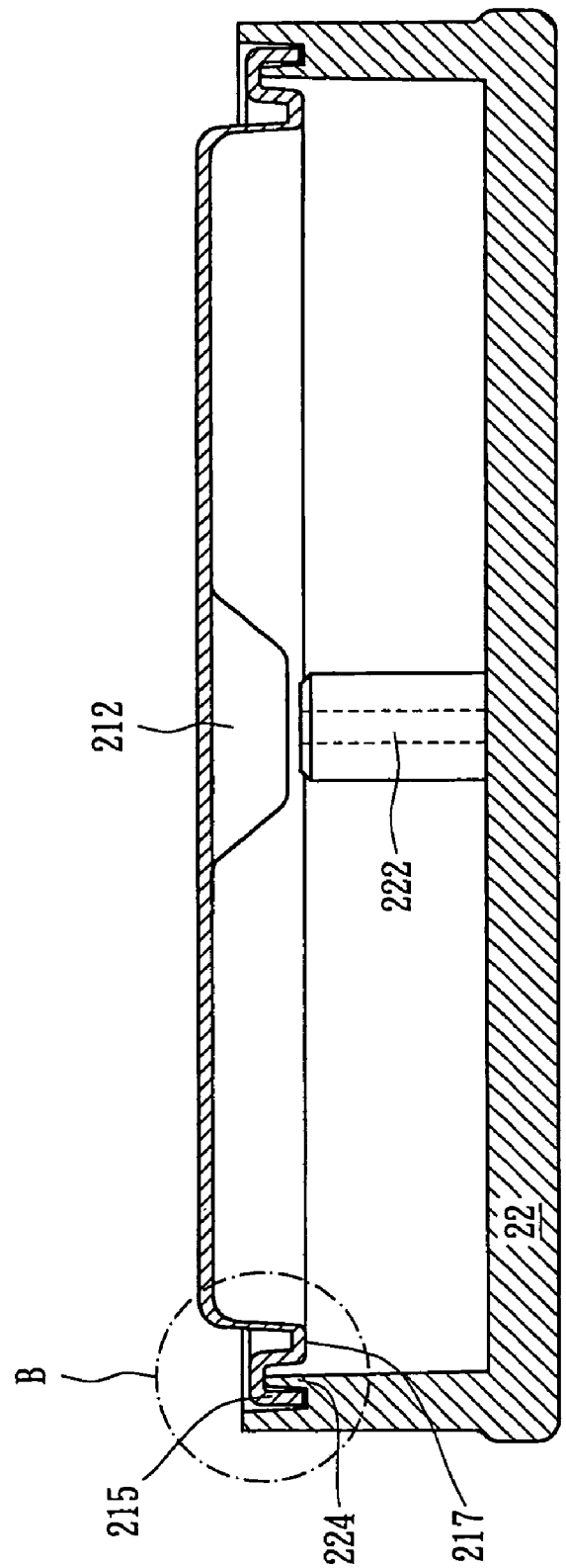
FIG. 5 is a schematic combination view of FIGS. 3 and 4.
Figure 6A:
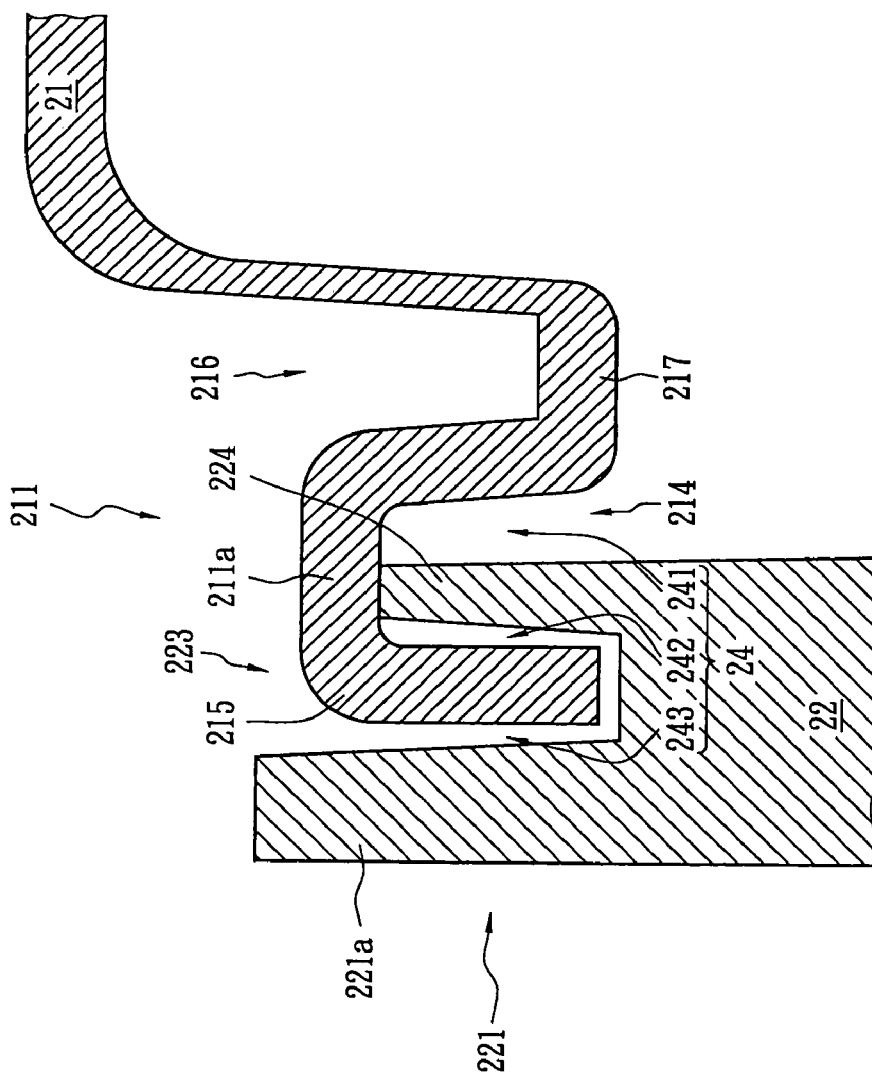
FIGS. 6(a) and 6(b) are partial enlarged views of FIG. 5.
Figure 6B:
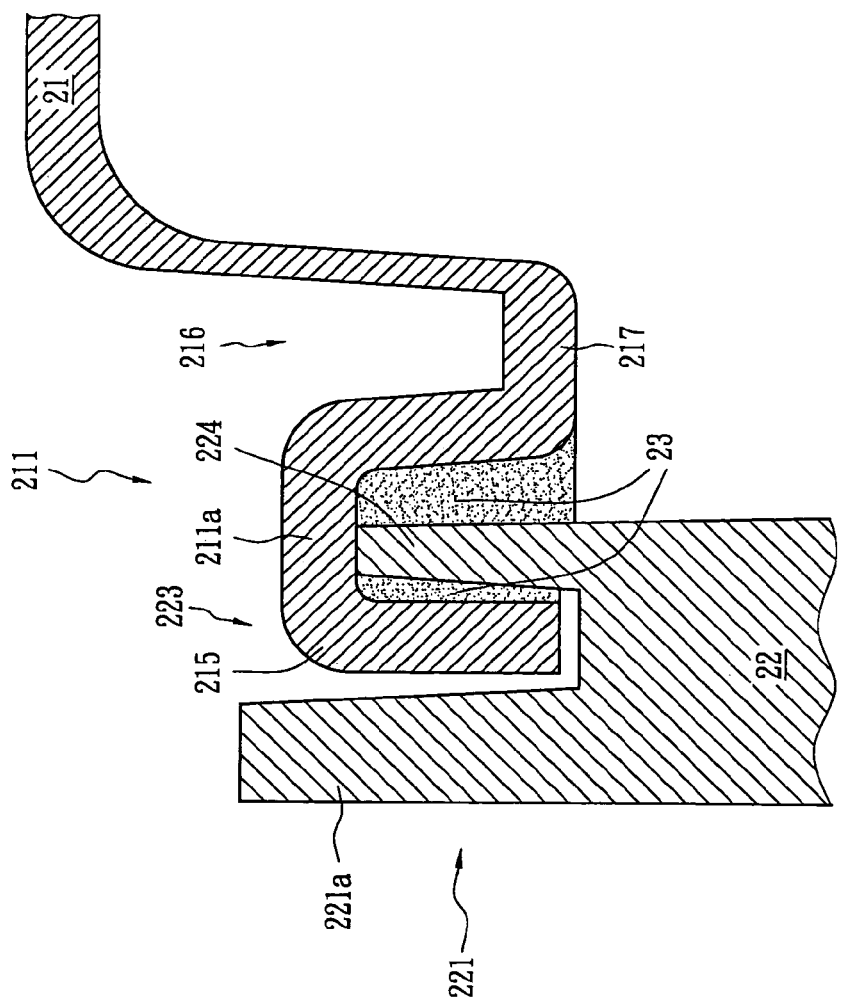

FIG. 2 shows an electromagnetic interference shielding apparatus 20 according to an embodiment of the present creation. The electromagnetic interference shielding apparatus 20 includes a metal cover 21, a chassis 22 having a waveguide output hole 25, two recess portions 212, and an adhesive 23 (refer to FIG. 6(b)). FIGS. 3 and 4 are sectional views of the metal cover 21 and the chassis 22, respectively, taken along a sectional line A-A' of FIG. 2. FIG. 5 is a schematic combination view of FIGS. 3 and 4. For the convenience of illustration, FIGS. 6(a) and 6(b) are partial enlarged views of region B in FIG. 5; FIG. 6(a) shows a situation in which the adhesive 23 is not included, whereas FIG. 6(b) shows a case in which the adhesive 23 is included.

Referring to FIGS. 2, 3, and 6(a), a first combination portion 211 having a first curved section 211a is disposed on an edge of the metal cover 21. In this embodiment, the metal cover 21 is a rectangular flat structure having four round corners 213, which is formed by pressing. The first curved section 211a is a substantially 90-degree-angle S-shaped structure, wherein the first curved section 211a has an outer cavity 214, an outer edge 215, an inner cavity 216 and a bottom edge 217 that is perpendicular to the outer edge 215 but is not connected to the outer edge 215. A second combination portion 221 having a second curved section 221a corresponding to the first combination portion 211 is disposed on an edge of the chassis 22, wherein the second combination portion 221 has a central cavity 223 and an inner branch 224. In this embodiment, the second curved section 221a is a U-shaped structure, which is coupled with the first curved section 221a. The chassis 22 is for carrying a signal transceiver (not shown), especially a satellite signal transceiver for transmitting signals in Ku band, C band, or Ka band. Referring to FIGS. 6(a) and 6(b), the outer edge 215 of the first combination portion 211 is inserted into the central cavity 223 of the second combination portion 221, and the inner branch 224 of the second combination portion 221 is inserted into the outer cavity 214 of the first combination portion 211. In addiction, the adhesive 23 is used to combine the first combination portion 211 and the second combination portion 221, and is disposed in a curved space 24 formed by the first curved section 211a and the second curved section 221a. The curved space 24 is separated into a first annular space 241, a second annular space 242, and a third annular space 243 by the first curved section 211a and the second curved section 221a. In this embodiment, the adhesive 23 is disposed in the first annular space 241 and the second annular space 242. The adhesive 23 is an adhesive suitable for outdoor applications (e.g., silica gel, or epoxy resin). Before combining the metal cover 21 and the chassis 22, the metal cover 21 is placed inside out first, such that the opening of a groove 214 (refer to FIG. 3) of the first combination portion 211 faces upward. Then, a proper amount of uncured adhesive is applied into the groove 214. After that, the chassis 22 is placed above the metal cover 21, such that the first combination portion 211 and the second combination portion 221 are coupled together, and the uncured adhesive is pressed by the weight of the chassis 21 (the weight of the chassis 21 is much greater than that of the metal cover 21). Leaving still the above structure for a while, the electromagnetic interface shielding apparatus 20 of FIG. 2 is formed. In this embodiment, because the metal cover 21 and the chassis 22 are adhered only by the adhesive 23, in addition to outputting the transmitted signal of the signal transceiver, the waveguide output hole 25 can also be connected to an external high-pressure gas source, so as to remove the metal cover 21 from the chassis 22. Thus, the process of removing a plurality of screws in the conventional art is omitted.

Furthermore, the two recess portions 212 correspond to two locking holes 222 on the central portion of chassis 22 (refer to FIG. 5). In order to enhance the combination capability of the metal cover 21 and the chassis 22, two locking members (e.g., screws) can be used to pass through bottoms of the two recess portions 212, so as to engage with the two locking holes 222. In other embodiments without the recess portions 212 and the corresponding locking holes 222, the leakage of internal high-frequency signals and the interference of external noises can also be effectively prevented, and the permeation of external moisture can be prevented as well, thereby meeting requirements of Protection Class IP68.

In view of the above, as compared with the conventional art, the electromagnetic interface shielding apparatus for a signal transceiver of the present invention employs two folded-edge mechanisms (i.e., the first and second combination portions in the metal cover and the chassis, respectively) that are coupled together with an adhesive to form a curved space. The curved space and the adhesive can effectively attenuate the power of high-frequency satellite signals (i.e., prevent signal leakage). Thus, the present invention complies with relevant communications laws and regulations, and meets the requirements of Protection Class IP68. Moreover, the present creation has the advantages of easy assembly, easy disassembly, and low material cost. The electromagnetic interface shielding apparatus for a signal transceiver of the present invention can be used as either an outdoor or indoor appliance. In practical applications, for the purpose of reducing volume or cost, the metal cover 21 or chassis 22 might be designed as one part of the signal transceiver.

The above-described embodiments of the present invention are intended to be illustrative only. Numerous alternative embodiments may be devised by those skilled in the art without departing from the scope of the following claims.

What is claimed is:

1. An electromagnetic interference shielding apparatus, applied to a signal transceiver, the electromagnetic interference shielding apparatus comprising:
    a metal cover comprising a first combination portion disposed on an edge of the metal cover, the first combination portion having a first curved section, wherein the first curved section has an outer cavity and an outer edge;
    a chassis having a waveguide output hole and a second combination portion disposed on an edge of the chassis, wherein the second combination portion has a second curved section and the second curved section has an inner branch and a central cavity, and the chassis carries the signal transceiver; and
    an adhesive combining the first combination portion and the second combination portion;
    wherein the outer edge is inserted into the central cavity, the inner branch is inserted into the outer cavity, and the adhesive is filled in the space between the inner branch and the outer cavity to prevent leakage of a transmitted signal and the waveguide output hole is used to output the transmitted signal of the signal transceiver; and
    wherein the metal cover includes a plurality of recess portions corresponding to a plurality of locking holes arranged in the chassis, and the recess portions and the locking holes are respectively positioned on the central portion of the metal cover and chassis and combined together with a plurality of locking members.

2. The electromagnetic interference shielding apparatus of claim 1, wherein the transmitted signal of the signal transceiver belongs to a Ku band, a C band, or a Ka band.

3. The electromagnetic interference shielding apparatus of claim 1, which meets requirements of Protection Class IP68.

4. The electromagnetic interference shielding apparatus of claim 1, wherein the locking members and the locking holes are screws and screw holes, respectively.

5. The electromagnetic interference shielding apparatus of claim 1, wherein the metal cover is a rectangular flat structure having four round corners.

6. The electromagnetic interference shielding apparatus of claim 1, wherein the adhesive is disposed in the curved space.

7. The electromagnetic interference shielding apparatus of claim 6, wherein the curved space comprises a first annular space, a second annular space, and a third annular space, and the adhesive is disposed in the first annular space and the second annular space.

8. The electromagnetic interference shielding apparatus of claim 1, wherein the first curved section is a 90-degree-angle S-shaped structure having a bottom edge perpendicular to the outer edge, the bottom edge is not directly connected to the outer edge, and the central cavity is a U-shaped structure.

9. The electromagnetic interference shielding apparatus of claim 1, wherein the waveguide output hole is capable of being connected to an external high-pressure gas source for removal of the metal cover from the chassis.

10. The electromagnetic interference shielding apparatus of claim 1, wherein the first combination portion has a groove capable of carrying the adhesive that is uncured before the metal cover and the chassis are combined.

* * * * *